US009200197B2

(12) United States Patent  (10) Patent No.: US 9,200,197 B2
Juang et al.  (45) Date of Patent: *Dec. 1, 2015

(54) METHOD OF PROVIDING A PHOSPHOR WITH A PRECISELY CONTROLLED ELEMENT COMPOSITION, A PHOSPHOR PROVIDED BY THE SAME, A PHOSPHOR, AND A LIGHT EMITTING DEVICE COMPRISING THE SAID PHOSPHOR

(75) Inventors: Yuan Ren Juang, Tainan (TW); Jen Shrong Uen, Tainan (TW); Chih Lung Lin, Tainan (TW)

(73) Assignee: CHI MEI CORPORATION, Tainan (TW)

( * ) Notice: Subject to any disclaimer, the term of this patent is extended or adjusted under 35 U.S.C. 154(b) by 1040 days.

This patent is subject to a terminal disclaimer.

(21) Appl. No.: 13/215,344

(22) Filed: Aug. 23, 2011

(65) Prior Publication Data

US 2012/0080704 A1  Apr. 5, 2012

(30) Foreign Application Priority Data

Sep. 30, 2010 (TW) ............................... 99133379 A
Oct. 15, 2010 (TW) ............................... 99135364 A
Oct. 15, 2010 (TW) ............................... 99135365 A
Mar. 25, 2011 (TW) ............................. 100110357 A

(51) Int. Cl.
*C09K 11/77* (2006.01)
*C04B 35/626* (2006.01)
*H01L 33/50* (2010.01)

(52) U.S. Cl.
CPC ........... *C09K 11/7734* (2013.01); *H01L 33/502* (2013.01)

(58) Field of Classification Search
CPC ............. C09K 11/025; C09K 11/7734; C09K 11/7728; C09K 11/0883; H01L 33/502; H01L 21/324; H01L 51/56; B01J 2219/00367; B01J 2219/00576; C04B 2235/6562; C04B 2235/66; C04B 35/6268; C04B 35/626; C04B 41/5064
USPC ............... 252/252, 301.36, 301.4 R, 301.4 F; 428/690; 313/183; 156/60; 264/21
See application file for complete search history.

(56) References Cited

U.S. PATENT DOCUMENTS 4,469,619 A * 9/1984 Ohno et al. ............ 252/301.4 R
4,520,045 A * 5/1985 Kutsuna et al. ................ 427/294

(Continued)

FOREIGN PATENT DOCUMENTS

CN  1918262 B  5/2011
JP  53142989 A * 12/1978

(Continued)

OTHER PUBLICATIONS

CIE chromacity diagram, http://hyperphysics.phy-astr.gsu.edu/hbase/vision/cie.html, web page printed Jun. 7, 2014, pp. 1-5.*

(Continued)

*Primary Examiner* — Carol M Koslow
*Assistant Examiner* — Lynne Edmondson
(74) *Attorney, Agent, or Firm* — Muncy, Geissler, Olds & Lowe PC

(57) ABSTRACT

A method of providing a phosphor with a precisely controlled element composition, a phosphor provided by the same, and a red phosphor represented by the [formula 1] are disclosed, in which $$Ca_a Sr_b Al_c Si_d O_e N_f : Eu_g \quad \text{[formula 1]}$$

wherein $0 \le a < 1$, $0 < b < 1$, $c=1$, $0.8 \le d \le 1.2$, $0 \le e \le 0.5$, $2.5 \le f \le 3.1$, $0.002 \le g \le 0.020$, a and b are not both 0 at the same time; and
a CIE1931 chromaticity coordinates (x, y) of a light emitted from the phosphor, which is excited by a wavelength of 455 nm, satisfies the formulae:

$$x=[(-0.1059b^3+0.068b^2-0.06b)+(2152.8g^3-309.2g^2+8.2943g)+0.6324]\pm 0.01;$$

$$y=[(-0.1295b^3-0.0968b^2+0.0702b)+(-3299.2g^3+311.08g^2-7.9266g)+0.3621]\pm 0.01.$$

The present invention also provides a light emitting device comprising the said red phosphor.

16 Claims, 2 Drawing Sheets

(56) References Cited

U.S. PATENT DOCUMENTS

| | | | | |
|---|---|---|---|---|
| 4,637,898 | A | * | 1/1987 | DeBoer et al. ............ 252/301.36 |
| 4,792,691 | A | * | 12/1988 | Morlotti et al. ............. 250/484.4 |
| 5,231,328 | A | * | 7/1993 | Hisamune et al. ............ 313/487 |
| 5,525,527 | A | | 6/1996 | Tran ................................ 438/96 |
| 8,203,259 | B2 | * | 6/2012 | Juang et al. .................... 313/484 |
| 2006/0255710 | A1 | * | 11/2006 | Mueller-Mach et al. ..... 313/485 |
| 2007/0007494 | A1 | | 1/2007 | Hirosaki et al. |
| 2009/0195142 | A1 | * | 8/2009 | Song et al. ..................... 313/483 |
| 2010/0295464 | A1 | * | 11/2010 | Kasakura et al. ............. 315/287 |
| 2012/0305958 | A1 | * | 12/2012 | Seibel et al. .................... 257/98 |

FOREIGN PATENT DOCUMENTS

| | | | |
|---|---|---|---|
| JP | 56147886 A | * | 11/1981 |
| JP | 58-57491 A | | 4/1983 |
| JP | 61178698 A | * | 8/1986 |
| JP | 1-304177 A | | 12/1989 |
| JP | P2005-239985 A | | 9/2005 |
| JP | P2006-8721 A | | 1/2006 |
| JP | 2006-282809 A | | 10/2006 |
| JP | 3837588 B2 | | 10/2006 |
| JP | 2006-307182 A | | 11/2006 |
| TW | 200536152 | | 11/2005 |
| WO | WO 2009063915 A1 | * | 5/2009 |
| WO | WO 2010/074963 A1 | | 7/2010 |

OTHER PUBLICATIONS

ARON Ceramic adhesive brochure printed Jun. 7, 2014, 2 pages.*

* cited by examiner

METHOD OF PROVIDING A PHOSPHOR WITH A PRECISELY CONTROLLED ELEMENT COMPOSITION, A PHOSPHOR PROVIDED BY THE SAME, A PHOSPHOR, AND A LIGHT EMITTING DEVICE COMPRISING THE SAID PHOSPHOR

CROSS REFERENCE TO RELATED APPLICATION

This application claims the benefits of the Taiwan Patent Application Serial Number 099133379, filed on Sep. 30, 2010, Taiwan Patent Application Serial Number 099135364, filed on Oct. 15, 2010, and Taiwan Patent Application Serial Number 099135365, filed on Oct. 15, 2010, Taiwan Patent Application Serial Number 100110357, filed on Mar. 25, 2011, the subject matter of which is incorporated herein by reference.

BACKGROUND OF THE INVENTION

1. Field of the Invention

The present invention relates to a method of providing a phosphor with a precisely controlled element composition, a phosphor provided by the same, and a red phosphor that can emit red light after excitation and can be used in a device such as a display or a light emitting diode. The present invention also relates to a light emitting device comprising the said red phosphor.

2. Description of Related Art

With the increasing demand for environmentaly-friendly and energy-saving light-sources, many efforts are being contributed to develop light-sources with high-efficiency, energy-saving and eco-friendly attributes. Light-emitting diodes (LEDs) are mostly appreciated to be used to replace traditional light sources due to their compactness, low heat output, low energy consumption, long lifespan as well as less fragility, low contamination (e.g. Hg contamination) upon being discarded, and low energy consumption. In general, white light LEDs are composed of a blue light-emitting source with yellow phosphor. However, the white light generated by such LEDs may lack red light wavelengths and result in low color rendering property and low color saturation. Also, the inherent low light-emitting efficiency of yellow phosphor may cause low luminance to white light. In order to solve the above problems, composite phosphor composed of yellow phosphor mixed with red phosphor are proposed therefore to increase both the color rendering property for white lights and color saturation, since the adding of red phosphor may contribute to increase the luminance efficiency that is lacked by only employ of yellow phosphor.

Red phosphor, for example, can use $Sr_2Si_5N_8$:Eu, $CaAlSiN_3$:Eu, or sialon phosphor (i.e. $M_zSi1_{2-(m+n)}Al_{m+n}O_nN_{16-n}$). However, the use of $Sr_2Si_5N_8$:Eu may decrease the color rendering property and color saturation since the $Sr_2Si_5N_8$:Eu has a short lifespan. Although there is no deficiency of low lifespan with sialon phosphor, low luminance may incur while using sialon phosphor and therefore it is not well-used commercially. The $CaAlSiN_3$:Eu has a long lifespan and a higher luminance than sialon phosphor has, but it still cannot satisfy the commercial need for high luminance and high lighting efficiency for the light emitting device.

The red phosphor of CaAlSiN3 Eu series, such as $Ca_mAl_a$-$Si_bN_n$:$Eu_z$ (in which (m+z):a:b:n=1:1:1:3) or $Ca_bSi_cAl_dN_n$:$Eu_a$ (in which a+b=1, 0.5≤c≤4, 0.5≤d≤8), can be provided by the steps shown below. A predetermined ratio of silicon nitride, aluminum nitride, calcium carbonate or calcium nitride, and europium oxide are mixed in a sintering holder, and then are sintered at 1700° C. of temperature, and greater than 10 atm of pressure under nitrogen atmosphere. The shortcoming of such method is that the high pressure (i.e. greater than 10 atm) may cause a dangerous explosion during manufacture, the manufacturing cost is increased due to the high cost of the equipment, and the color rendering property and the color saturation cannot be greatly increased due to the narrow wavelength range of the red phosphor. Besides, the required luminance cannot be obtained with the above method.

Therefore, it is desirable to provide an improved method to fabricate a red phosphor with a higher luminance and a higher light-emitting efficiency compared with a conventional phosphor of the same series, and which therefore can be further applied into the fabricating of white light LEDs having high color rendering property and high color saturation.

SUMMARY OF THE INVENTION

The object of the present invention is to provide a method of providing a phosphor with a precisely controlled element composition, which enables the manufacture of a phosphor with high luminance.

To achieve the object, the method of providing a phosphor with a precisely controlled element composition of the present invention comprises steps: (A) providing a sintering holder comprising a main body and a closure member, in which the main body has a sintering space, and the closure member is used to close the sintering space;

(B) placing a raw material of the phosphor in the sintering space of the main body;

(C) coating an adhesion agent on at least one of the main body and the closure member; and (D) heating the sintering holder containing the raw material under a non-oxidizing gas atmosphere to obtain a phosphor.

Another object of the present invention is to provide a phosphor made by the above method.

The inventor of the present invention especially concentrated on developing a novel phosphor which can increase the color rendering property and color saturation of a white light emitting device as well as satisfy the commercial demands for high luminance of phosphors. Therefore, the third object of the present invention is to provide a phosphor with high luminance.

The phosphor is represented by the [formula 1] below. [formula 1]

$$Ca_aSr_bAl_cSi_dO_eN_f:Eu_g, \qquad \text{[formula 1]}$$

wherein 0≤a<1, 0≤b<1, c=1, 0.8≤d≤1.2, 0≤e≤0.5, 2.5≤f≤3.1, 0.002≤g≤0.020, a and b are not both 0 at the same time; and a CIE1931 chromaticity coordinates (x, y) of a light emitted from the phosphor, which is excited by a wavelength of 455 nm, satisfies the formulae:

$$x=[(-0.1059b^3+0.068b^2-0.06b)+(2152.8g^3-309.2g^2+8.2943g)+0.6324]\pm 0.002;$$

$$y=[(-0.1295b^3-0.0968b^2+0.0702b)+(-3299.2g^3+311.08g^2-7.9266g)+0.3621]\pm 0.002.$$

The fourth object of the present invention is to provide a light-emitting device with excellent color rendering property, high color saturation, and high luminous efficiency, which comprises: a light emitting unit comprising a light emitting element; and a phosphor described above.

According to the present invention, by the use of the adhesion agent, a phosphor with an element composition ratio close to a predetermined optimized ratio can be obtained, namely the difference regarding the chemical compositions between the raw material and the resultant phosphor can be minimized. For that reason, the manufacturing cost can be lowered and a phosphor with high luminance can be realized. In addition, the light emitted by the phosphor of the present invention has chromaticity and high luminance apparently higher than that of prior arts of the same series.

Other objects, advantages, and novel features of the invention will become more apparent from the following detailed description when taken in conjunction with the accompanying drawings.

DETAILED DESCRIPTION OF THE PREFERRED EMBODIMENT

Figure 1:
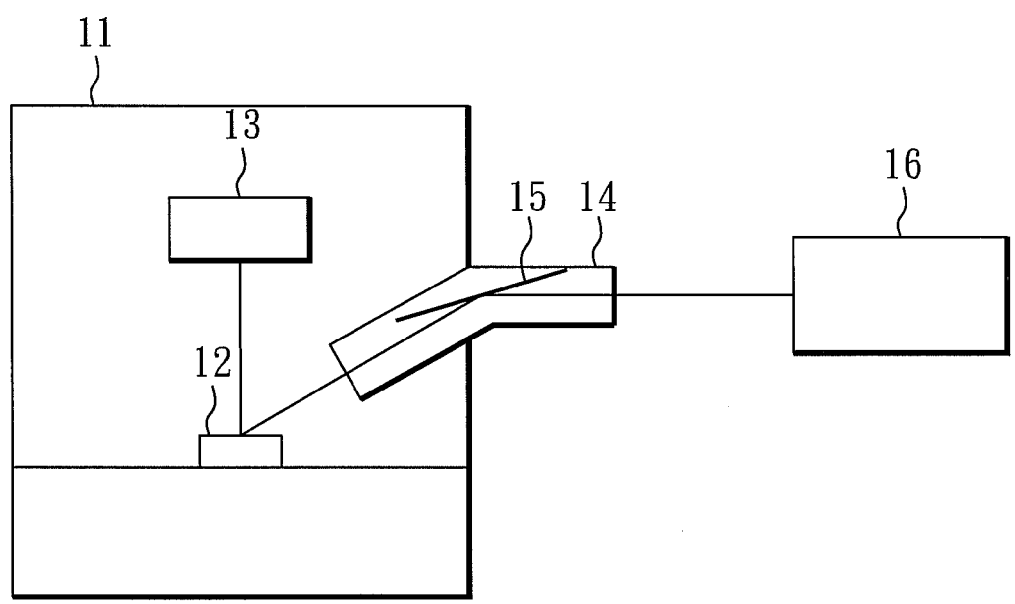
FIG. 1 is a schematic diagram of a luminance meter.

The method of providing a phosphor with a precisely controlled element composition comprises steps: (A) providing a sintering holder comprising a main body and a closure member, in which the main body has a sintering space, and the closure member is used to close the sintering space; (B) placing a raw material of the phosphor in the sintering space of the main body; (C) coating an adhesion agent on at least one of the main body and the closure member, and attaching the closure member to the main body to close the sintering space; and (D) heating the sintering holder with the raw material under a non-oxidizing gas atmosphere to obtain a phosphor.

According to the method of the present invention, in the step (D), the adhesion agent is preferably cured to form a compact structure during the heating process.

According to the method of the present invention, in the step (D), the adhesion agent is preferably used to seal the main body and the closure member to make the sintering space airtight.

According to the method of the present invention, the sintering holder is preferably made of SiAlON; aluminum nitride such as AlN; boron nitride such as BN; or a combination thereof, more preferably made of boron nitride.

According to the method of the present invention, the raw material of the phosphor comprises at least one element source, the "element source" indicates a nitride, oxide, or metal of the elements composing the phosphor. The said oxide is not limited to the compound provided by reacting only with oxygen; the oxide also includes carbonates or oxalates that can be decomposed into the above element (that composing the phosphor) and oxygen, namely the carbonates and oxalates are also belonging to the field of oxides. The same situation may apply to the nitrides herein, therefore is not described in detail. Preferably, the raw material of the phosphor comprises aluminum source, silicon source, europium source, and at least one selected from a calcium source and a strontium source. Preferably, the aluminum source, silicon source, europium source, calcium source, and strontium source are aluminum nitride, silicon nitride, europium oxide, calcium nitride, and strontium nitride respectively. According to an exemplary embodiment, the aluminum nitride is AlN, the silicon nitride is $Si_3N_4$, the europium oxide is $Eu_2O_3$, the calcium nitride is $Ca_3M_2$, and the strontium nitride is $Sr_3N_2$.

Preferably, the mole ratio between the calcium, strontium, aluminum, silicon, and europium in the calcium source, strontium source, aluminum source, silicon source, and europium source, respectively is [calcium:strontium:aluminum:silicon:europium]=[(0.01~0.999):(0~0.99):(0.95~1):1:(0.002~0.02)]. More preferably, the mole ratio is [calcium:strontium:aluminum:silicon:europium]=[(0.018~0.993):0~0.972):(0.95~1):1:(0.002~0.016)]. That is, based on 1 mole silicon that is provided from the silicon source (i.e. take 1 mole silicon as a base), the mole ratio of the calcium is 0.018~0.993 (in which the calcium is obtained from the calcium source), the mole ratio of the strontium is 0~0.972 (in which the strontium is obtained from the strontium source); the mole ratio of the aluminum is 0.95~1 (in which the aluminum is obtained from the aluminum source); and the mole ratio of the europium is 0.002~0.016 (in which the europium is obtained from the europium source).

According to the present invention, the oxygen of the phosphor can be obtained from the calcium source, strontium source, aluminum source, silicon source, and europium source. Preferably, the raw material may further comprise an oxygen source for providing oxygen atoms to the phosphor. In a specific example of the present invention, the oxygen source may be aluminium oxide ($Al_2O_3$) or europium oxide. Preferably, based on 1 mole silicon provided from the silicon source, the amount of the oxygen (obtained from the oxygen source) is 0~0.3 mole, and more preferably, 0~0.075 mole.

The purity of each raw material of the phosphor is the higher the better, and the purity of each raw material may be preferably 2N; and more preferably 3N (99.9%). In order to increase the luminance of the phosphor, it is preferable that the content of the contaminant in the raw material is as low as possible, especially the content of atoms such as iron, cobalt, nickel, fluorine, boron, chloride, or carbon should be well controlled so as to maintain the light-emitting efficiency of the phosphor. For example, a raw material of high purity should be selectively used, in which the content of iron, cobalt, nickel, fluorine, boron, chloride, or carbon atoms should each be less than 1000 ppm.

According to the present invention, the particle size and shapes of the phosphor may be different depending on the particle size and shapes of the raw materials. The particle size of the raw material is not particularly limited, as long as the particle size of the raw material accords with the expected particle size of the phosphor. Preferably, from the promoting reaction point of view, the particle sizes of each of the ingredients in the raw materials are mainly microparticles Since the raw materials of the phosphor are easily wetted due to the humidity in the atmosphere, the weighing operation of the raw materials such as $Ca_3N_2$, or $Sr_3N_2$ should be conducted in a glove box filled with an inactive gas, preferably a moisture-free inactive gas. The method for mixing the raw materials may use a dry method (e.g. a dry ball milling method) a wet method (e.g. a wet ball milling method), or a combination thereof, but is not limited thereto. The mixing equipment may use a ball mill or a mortar.

The coating position of the adhesion agent on the main body and the closure member is not specially limited, and the coating position of the adhesion agent depends on the corresponding size of location between the main body and the closure member. When the adhesion agent is heated, the adhesion agent is cured to form a compact structure therefore to firmly attach the main body with the closure member. In detail, when the sizes of the main body and the closure member are very close or the same, the adhesion agent can be applied to the upper edge of the main body and/or the contacting portion of the upper edge of the main body and the closure member. When the closure member has a size larger than that of the main body, the adhesion agent can be applied to the sidewall of the main body and/or the contacting part between the sidewall of the main body and the closure member.

According to the method of the present invention, the adhesion agent is not specially limited, as long as the adhesion agent can be cured to form a compact structure to seal the main body and the closure member tightly and make the sintering space airtight. Through the use of the adhesion agent, the airtightness of the whole sintering holder can be improved, and the sintering space in the sintering holder can be completely isolated from the outer space of the sintering holder, so as to prevent the raw materials from evaporating and avoid any impurities (e.g. oxygens) contaminating the raw materials in the sintering space, and therefore can obtain a resulted phosphor with a predetermined content ratio between the elements. Preferably, the adhesion agent comprises boron nitride, and at least one of an alkaline earth metal nitride and a boron oxide, in which the alkaline earth metal nitride may be beryllium nitride, calcium nitride, strontium nitride, magnesium nitride, barium nitride. Preferably, the content of the boron nitride is that every 1 mole of the adhesion agent comprises 0.5 mole or above of the boron nitride, namely the adhesion agent comprises 50 mole % or above of boron nitride. Preferably, the adhesion agent comprises boron oxide, strontium nitride, and 50 mole % or above of boron nitride. The quantity of the adhesion agent used in the present invention depends upon the size of the sintering holder. The quantity of the adhesion agent used should be able to completely seal the main body and the closure member.

The sintering process is not specially limited, as long as the raw materials can be heated and sintered under an non-oxidizing gas atmosphere to produce a phosphor. Preferably, the sintering process may use an atmospheric pressure sintering method or an air pressure sintering method that is pressurized by gas. The heating process is not specially limited, preferably may use a metal resistor heater, graphite resistor heater, or a combination thereof. The sintering process should be performed under an non-oxidizing gas atmosphere, such as an atmosphere filled with nitrogen, hydrogen, ammonia gas, argon, or a combination thereof. The particle size of the phosphor may be adjusted by the sintering temperature, for example, a small particle size can be obtained with a low sintering temperature, and a large particle size can be obtained with a high sintering temperature. In the present invention, the sintering temperature is preferably in a range of 1200° C.~2200° C., more preferably in a range of 1400° C.~2000° C. The heating rate is preferably in a range of 3° C./min~15° C./min. The sintering time depends on the composition of the raw materials, preferably the sintering time is in a range of 1 hour~2 hours. The sintering pressure is preferably 0.5 Mpa or less, more preferably 0.1 Mpa or less. After the sintering process, a phosphor of the present invention can be produced, which can be further milled by a ball miller or an industrial crusher, and can be further washed, filtered, dried, or sorted.

According to the method of the present invention, the adhesion agent is cured to form a compact structure during the heating process and is used to seal the main body and the closure member to make the sintering holder airtight.

The present invention provides a phosphor, which can be represented by the [formula 1]:

$$Ca_aSr_bAl_cSi_dO_eN_f:Eu_g;$$  [formula 1]

wherein $0 \le a < 1$, $0 < b < 1$, $c=1$, $0.8 \le d \le 1.2$, $0 \le e \le 0.5$, $2.5 \le f \le 3.1$, $0.002 \le g \le 0.020$, and a and b are not both 0 at the same time.

Preferably, $0.05 \le a \le 0.9$.
Preferably, $0.10 \le b \le 0.95$.
Preferably, $0.15 \le a+b < 1$.
Preferably, $0.1 \le a/b \le 10$.
Preferably, $0.9 \le d \le 1.1$.
Preferably, $0 \le e \le 0.3$.
Preferably, $2.7 \le f \le 3.0$ When the values of a, b, c, d, e, and f are in the range described above, a high luminance of the phosphor can be obtained. When the value of g is greater than 0.020, the luminance may be decreased because interferences between those Eu elements may cause a concentration quenching phenomenon. Preferably, the value of g is in a range of $0.005 \le g \le 0.016$ for a high luminance.

Preferably, the phosphor may also comprise at least one element selected from the group consisting of iron, cobalt, nickel, fluorine, boron, chloride, and carbon, in which each of them is in a content of 1000 ppm or less.

Preferably, the phosphor may also comprise magnesium and/or barium to increase the luminance of the phosphor. The magnesium content in the phosphor may be in a range of 20 ppm~1500 ppm, or the barium in the phosphor may be in a range of 40 ppm~5000 ppm.

Reference with FIG. 1, the luminance and the coordinates of chromaticity can be measured by a luminance meter, which comprises: a black chamber 11, a sample holder 12, a light source 13, a light guide tube 14, a mirror 15, and a luminance meter 16 (TOPCON, SR-3A), in which the sample holder 12 is set in the chamber 11, and the light source 13 is set at a place about 5 cm above the sample holder 12. The diameter of the light guide tube 14 is about 2 cm and an angle of the light source 13 is about 45 degrees. The mirror 15 is set in the light guide tube 14 and is in a distance to the sample holder 12 about 8 cm. The distance between the luminance meter 16 and the mirror 15 is about 40 cm. When the sample holder 12 is filled with the phosphor and is illuminated via the light source 13, a light is illuminated from the phosphor, passes through the light guide tube 14, and is reflected by the mirror 15 to the luminance meter 16. Herein, a field 1° mode can be chosen to measure the luminance and the coordinates of chromaticity of the light illuminated from the phosphor.

The comparison of luminance is required under the same value of chromaticity. Herein, "the same value of chromaticity" indicates that the difference between the x-chromaticity coordinate and the y-chromaticity coordinate is ±0.002 or less. Preferably, based on taking the light which is reflected by radiating a light with wavelength of 455 nm on the barium sulphate as one unit, and based on the same value of chromaticity, the corresponding luminance of the phosphor of the present invention is in a range of 55 units~235 units, which is higher than the luminance of the conventional phosphor (the comparative example) that has a luminance of about 71 units~99 units. For example, according to the phosphor of the example 3 and comparative example 2, both CIE 1931 chromaticity coordinates (x, y) thereof are (0.654, 0.344±0.002), whereas the luminances are 114 units and 74 units respectively. Therefore, it can be seen that the phosphor of the present invention has a high luminance and can be applied to a light emitting device to ensure a high luminance.

In the case of a conventional phosphor, when the phosphor is radiated with a light having wavelength of 450 nm~460 nm, the light emitted from the phosphor may have a CIE 1931 chromaticity coordinates (x, y) of $0.617 \le x \le 0.6699$, and $0.3263 \le y \le 0.382$. The phosphor of the present invention have broader chromaticity coordinates when radiated with a light having wavelength of 455 nm, the light emitted from the phosphor may have a CIE 1931 chromaticity coordinates (x, y) of 0.588≤x≤0.683, and 0.315≤y≤0.409. Preferably, the phosphor of the present invention, when radiated with a light having wavelength of 455 nm, the light emitted from the phosphor may have a CIE 1931 chromaticity coordinates (x, y) of 0.670≤x≤0.683, and 0.315≤y≤0.326, which is close to the red region in a CIE 1931 chromaticity diagram, and therefore the phosphor of the present invention may be combined with other light emitting elements and/or phosphors for the application to a light emitting device for better color saturation and luminance performance. For instance, according to the examples 1 and 14 of the present invention, when the phosphor is radiated by a light having wavelength of 455 nm, the light emitted from the phosphor may have CIE 1931 chromaticity coordinates (x, y) of (0.674, 0.324) and (0.680, 0.317) respectively, which is indeed closer to the red region in a CIE 1931 chromaticity diagram compared with those of conventional arts. When the quantity of strontium is increased, not only the luminance may increase, but also the y value of the CIE 1931 chromaticity coordinates may increase, as a result, the chromaticity coordinates of the light illuminated by the phosphor may be away from the red region in the chromaticity coordinates. When europium is added, the y value of the chromaticity coordinates may be decreased. As a result the chromaticity coordinates of the light illuminated by the phosphor may be close to the red region in the chromaticity coordinates, and the luminance may be reduced. However, compared with a conventional phosphor, the phosphor of the present invention has a higher y value and a higher luminance, which means the light emitted by the phosphor of the present invention has chromaticity coordinates closer to the red region and has a longer wavelength, which can satisfy the commercial demands for long wavelength, high color saturation, and high luminance for a phosphor.

According to the present invention, when the phosphor is presented in a form of powder, since the light occurs only on the surface of the powder, a surface area per unit weight can be increased if the average diameter (D50) is decreased to 30 μm or below, and therefore can maintain the luminance at a preferred value. Meanwhile, when combining the phosphor with the light emitting element, the phosphor coated on the light emitting element may have an increase in unit area density, and the luminance can be kept within a desired value. However, if the average diameter is less than 1 μm, the luminance may become worse. Herein, the average diameter ($D_{50}$) is preferably in a range of 1 μm≤$D_{50}$≤30 μm; and more preferably in a range of 3 μm≤$D_{50}$≤25 μm.

The a, b, d, e, and f values of the resultant phosphor of the present invention, which are obtained from the composition analysis, are just slightly different from the a, b, d, e, and f values of the raw materials, whereas such difference can be contributed to a small amount of the compositions are decomposed or don't enter the crystalline lattice, hence are removed by water, or just an analytical error occurs. Particularly, the deviation of the e value may be due to the oxygen adsorptive on the surface of the raw materials, or the oxygen by the oxidization when weighing, mixing, or annealing the raw materials, or the moisture or oxygen adhering on the surface of the phosphor after annealing. In addition, when the annealing process is performed in an atmosphere filled with nitrogen and/or ammonia gas, the replacement of oxygen atoms by the nitrogen atoms may also cause some deviation of the e value.

As mention above, by the use of the adhesion agent, the airtightness of the whole sintering holder can be improved, and the sintering space in the sintering holder can be completely isolated from the outer space of the sintering holder, so as to prevent the raw materials from evaporation and avoid impurities (e.g. oxygen) contaminating the raw materials in the sintering space, and therefore can obtain a resulted phosphor with a predetermined content ratio between the elements, and can increase the luminance of the phosphor.

Strontium and calcium are easily oxidized, and the content of strontium and calcium in the phosphor may influence the luminance of the phosphor itself. In the present invention, by the use of the adhesion agent, the airtightness of the whole sintering holder can be improved, and elements such as strontium and calcium, which inherently tend to be easily vaporized, can be blocked firmly in the sintering holder and efficiently combined with other atoms to provide an optimized phosphor. Therefore, the difference of the chemical compositions between the raw material and the resultant phosphor can be minimized, so that the manufacturing cost can be lowered and a phosphor with high luminance can be realized compared with a conventional phosphor of the same series, and the object of the present invention can be achieved. In addition, the light emitted by the phosphor of the present invention has chromaticity and luminance apparently higher than those of prior arts of the same series. Even though a conventional red phosphor may have a value of chromaticity the same as that of the phosphor of the present invention, the conventional phosphor of the same series still can not have the same composition and luminance as those of the present invention. Specifically what induces an increase in the luminance and the color rendering property is still not clearly understood, but the inventor of the present invention believes the increase of the luminance and the color rendering property is due to the airtightness of the sintering holder, which prevents pollutants from entering the sintering holder and prevents the raw materials being evaporated. As a result, an excellent crystal structure is obtained with fewer defects, compared with a conventional phosphor of the same series. Meanwhile, according to the present invention, the energy transmission rate of the phosphor can be raised, which may enhance a high light-emitting efficiency and a high luminance to the phosphor.

Thereby, the crystal field of the europium (Eu) atoms of the phosphor of the present invention is different from that of a conventional phosphor of the same series. Furthermore, the distance of Eu—N of the phosphor of the present invention is longer than that of a conventional phosphor of the same series, which may cause a difference to the energy level in excited state. For example, while using blue light as an excitation light source, an effective absorption may occur in the blue light range which can increase the luminance of the phosphor, so as to make a higher luminance as well as a broader range of value of chromaticity of the phosphor of the present invention comparing with those of prior arts of the same series.

The phosphor of the present invention may be preferably used in a vacuum fluorescent display (VFD), a field emission display (FED), a plasma display panel (PDP), a cathode ray tube (CRT), a light-emitting diode (LED), etc.

The light emitting device of the present invention, comprising: a light emitting unit comprising a light emitting element; and the above said phosphor, wherein the phosphor can be excited with the light emitted from the light emitting element to emit a light other than the excited light.

The light emitting element may be a semiconductor that is preferably made of materials such as zinc sulfide or gallium nitride, more preferably made of gallium nitride. Gallium nitride can be formed on the substrate with a metal-organic chemical vapor deposition (MOCVD) method or a hydride vapor phase epitaxy (HVPE) method. Preferably, the light emitting element is made of $In_\alpha Al_\beta Ga_{1-\alpha-\beta}N$, wherein 0≤α, 0≤β, α+β<1.

The light emitting element in the light emitting device may emit a light having preferably a wavelength of 300 nm~550 nm, more preferably a wavelength of 330 nm~500 nm.

Figure 2:
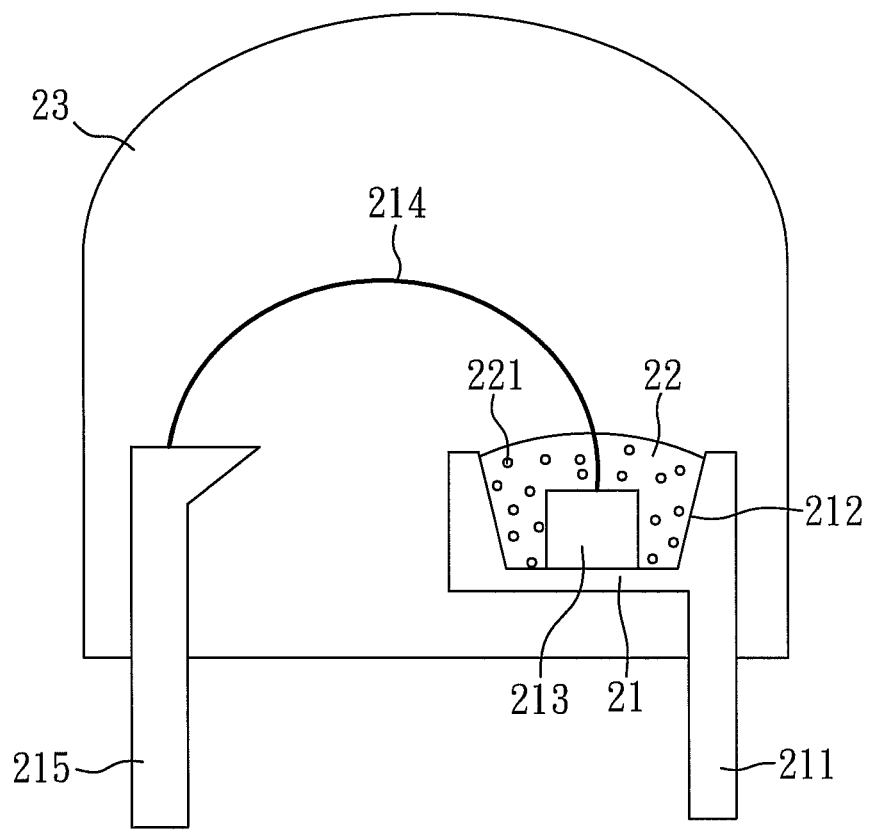
FIG. 2 is a schematic view of a light emitting device of a preferred example of the present invention.

Reference with FIG. 2, a light emitting device of the present example is shown, which comprises a light emitting unit 21, a phosphor layer 22 and an encapsulating layer 23.

The light emitting unit 21 comprises an electrically conductive base 211, a concave 212, a light emitting element 213 locating in the concave 212 and connecting with the base 211, an electric wire 214 connecting with the light emitting element 213, and a leading wire 215 connecting with the electric wire 214. The base 211 and the leading wire 215 conduct electricity from the outer electricity source to the light emitting element 213, whereas the light emitting element 213 transforms the electricity into light and emits it. The present example is to adhere an InGaN light emitting element 213 (having a wavelength of 455 nm, provided from CHI MEI LIGHTING TECHNOLOGY CORP.) in the concave 212 of the base 211 by using a conductive silver glue (BQ6886, provided by UNINWELL) and followed by extending an electric wire 214 and a leading wire 215 from the top of the light emitting element 213, in which the electric wire 214 and the leading wire 215 electrically connect with the light emitting element 213.

The fluorescent layer 22 covers the light emitting element 213. When the phosphor 221 in the fluorescent layer 22 is excited by the light emitted from the light emitting element 213, the light will be transferred and another light will be emitted from the phosphor 221, which is different from the original light emitted from the light emitting element 213. In the present example, the fluorescent layer 22 is made by coating a polysiloxane resin that is mixed with the phosphor 221 on the light emitting element 213 and followed by drying and curing.

The encapsulating layer 23 encapsulates part of the base 211 of the light emitting unit 21, the electric wire 214, the leading wire 215, and the phosphor layer 22.

According to the present invention, the phosphor can be used independently or can be used with other phosphors to provide a light emitting device with a desired color.

For example, the phosphor of the present invention can be used with an ultra-violet (LTV) light emitting element that can radiate light having a wavelength of 330 nm~420 nm; a blue phosphor (e.g. $BaMgAl_{10}O_{17}$:Eu) that can radiate light having a wavelength of 420 nm~500 nm; and a green phosphor (e.g. sialon phosphor) that can radiate light having a wavelength of 500 nm~570 nm, therefore to give a light emitting device. When a UV light emitted from the UV light emitting element is emitted to those phosphors, a red, a green, and a blue light will thus be emitted and mixed with the UV light to give a white light, and therefore the light emitting device becomes a white light emitting device (e.g. a lighting apparatus, light emitting diode, etc).

For another example, the phosphor of the present invention can be used with a blue light emitting element that can radiate light having a wavelength of 420 nm-500 nm, and a yellow phosphor (e.g. $Y_3Al_5O_{12}$:Ce) that can radiate light having a wavelength of 550 nm~600 nm, therefore to give a light emitting device. When a blue light emitted from the blue light emitting element is emitted to the phosphors, a red and a yellow light will thus be emitted and mixed with the blue light to give a white light, and therefore the light emitting device becomes a white light emitting device (e.g. a lighting apparatus, light emitting diode, etc).

Now, the present invention will be described in more detail with reference to the following Examples. These examples are provided only for illustrating the present invention and should not be construed as limiting the scope and spirit of the present invention.

EXAMPLE 1

0.277 mole of $Ca_3N_2$, 0.054 mole of $Sr_3N_2$, 1 mole of AlN (purity 3N), 0.333 mole of $Si_3N_4$ (purity 3N), and 0.004 mole of $Eu_2O_3$ (purity 4N) are mixed by a mortar in a glove box in a nitrogen environment to provide a phosphor raw material.

The phosphor raw material is placed in a sintering holder made of boron nitride. Then, an adhesion agent, which is made by mixing boron nitride, strontium nitride, and boron oxide in a ratio of [boron nitride:strontium nitride:boron oxide]=10:1:1, is applied to the upper edge of the main body and the contacting portion of the closure member, and the contacting portion is corresponding to the upper edge of the main body. Subsequently, a 500 g plate made of boron nitride is placed on the top of the closure member to press the closure member. After that, the sintering holder is transported to a high temperature furnace that is filled with high purity nitrogen, the flow rate of the nitrogen gas is 80 L/min, the temperature is raised in a rising rate of 10° C./min until reaching 1800° C. and is kept at 1800° C. for 12 hours while the operation pressure of the furnace is kept at 0.1 MPa accordingly to sinter the raw material in the sintering holder. After sintering, the temperature is cooled in a rate of 10° C./min until reaching the room temperature, then followed by steps such as crushing, ball milling, washing with water twice, drying, and sorting so as to provide the phosphor of the present example.

The phosphor is analyzed with a nitrogen/oxygen analyzer and an inductively coupled plasma-atomic emission spectrometer (ICP-AES) to obtain the composition of Ca: 22.33 wt %, Sr:8.96 wt %, Al:18.77 wt %, Si: 19.49 wt %, Eu: 0.85 wt %, N: 27.92 wt %, 0:1.69 wt %. Therefore, the formula of the phosphor can be represented as $Ca_{0.801}Sr_{0.147}Al_1Si_{0.998}N_{2.866}O_{0.152}$:$Eu_{0.008}$, in which the average diameter (D50) of the phosphor is 7.5 μm.

EXAMPLE 2

The same steps used in the example 1 are used in the present example 2 to provide the phosphors, except that the amounts of $Ca_3N_2$, $Sr_3N_2$, AlN, $Si_3N_4$, $Al_2O_3$, and $Eu_2O_3$ are changed. The corresponding conditions (i.e. the amounts) are listed in the Table 1. The phosphor is analyzed with a nitrogen/oxygen analyzer and an inductively coupled plasma-atomic emission spectrometer (ICP-AES), and from the result therefore the phosphor can be represented as $Ca_{0.625}Sr_{0.2972}Al_1Si_{0.997}N_{2851}O_{0.171}$:$Eu_{0/008}$.

EXAMPLES 3-15

The same steps used in the example 1 are used in the examples 3-15 to provide the phosphors, except that the amounts of $Ca_3N_2$, AlN, $Si_3N_4$, $Al_2O_3$, and $Eu_2O_3$ are changed. The corresponding conditions (i.e. the amounts) are listed in the Table 1. The analysis items for those phosphors of the examples 3-15 are listed in the Table 2.

COMPARATIVE EXAMPLES 1-7

The same steps used in the example 1 are used in the comparative examples 1-7 to provide the phosphors, except that the amounts of $Ca_3N_2$, $Sr_3N_2$, AlN, $Si_3N_4$, and $Eu_2O_3$ are changed and the sintering process in the comparative examples 1-5 is proceeded in a nonairtight condition. The corresponding conditions (i.e. the amounts) are listed in the Table 1. The analysis items for those phosphors of the comparative examples 1-7 are listed in the Table 2.

[Analysis Items]

1. Analysis of luminance and chromaticity coordinates: An LED light source with wavelength of 455 nm and a luminance meter are used to measure the luminance and chromaticity coordinates. The luminance measuring deviation is ±0.3% or less, and the chromaticity coordinates measuring deviation is ±0.0005% or less. The sample holders are filled and randomly distributed with barium sulphate, and phosphors of examples 1-15 and comparative examples 1-7 respectively for measurement.

2. Analysis of Element Compositions of Phosphor:

2-1 Analysis by Inductively Coupled Plasma-Atomic Emission Spectrometer (Jobin YVON; ULTIMA-2):

0.1 g of phosphors of examples 1-15 and comparative examples 1-7 are placed in the platinum crucibles respectively, 1 g of sodium carbonate ($Na_2CO_3$) is added and mixed with the phosphor, then the mixture is transferred to the high temperature furnace to be melted at 1200° C. (the temperature is raised from room temperature in 2 hours to reach 1200° C. and is kept at 1200° C. for 5 hours). After that, the temperature is cooled and 25 ml of 36 wt % hydrochloric acid is added, followed by heating to 300° C. to melt until the solution is clarified. The solution is moved into a 100 ml volumetric flask, water is added to the marked line, and measurement is proceed later.

2-2 Analysis by Nitrogen/Oxygen Analyzer (Horiba; EMGA-620W):

20 mg of phosphors of the example 1 and 2 are transferred into stannum capsules and placed in a crucible for measurement.

3. Analysis of Average Diameter $D_{50}$:

Beckman Coulter Multisizer-3 counter is used with the coulter method to analyze. $D_{50}$ represents that a cumulative volume of the particle having a size smaller than the predetermined value is 50% of the total volume.

TABLE 1

| | | | | Quantity (mole) | | | | | Sintering condition | | |
| | Composition of the raw materials | $Ca_3N_2$ | $Sr_3N_2$ | AlN | $Si_3N_4$ | $Al_2O_3$ | $Eu_2O_3$ | airtightness | Temp. (° C.) | Time (hr) | Pressure (MPa) |
|---|---|---|---|---|---|---|---|---|---|---|---|
| Example | 1 $Ca_{0.83}Sr_{0.162}Al_1Si_1O_{0.012}N_{2.995}$: $Eu_{0.008}$ | 0.277 | 0.054 | 1 | 0.333 | — | 0.004 | Y | 1800 | 12 | 0.1 |
| | 2 $Ca_{0.65}Sr_{0.342}Al_1Si_1O_{0.012}N_{2.995}$: $Eu_{0.008}$ | 0.217 | 0.114 | 1 | 0.333 | — | 0.004 | Y | 1800 | 12 | 0.1 |
| | 3 $Ca_{0.45}Sr_{0.542}Al_1Si_1O_{0.012}N_{2.995}$: $Eu_{0.008}$ | 0.15 | 0.181 | 1 | 0.333 | — | 0.004 | Y | 1800 | 12 | 0.1 |
| | 4 $Ca_{0.25}Sr_{0.742}Al_1Si_1O_{0.012}N_{2.995}$: $Eu_{0.008}$ | 0.083 | 0.247 | 1 | 0.333 | — | 0.004 | Y | 1800 | 12 | 0.1 |
| | 5 $Ca_{0.20}Sr_{0.792}Al_1Si_1O_{0.012}N_{2.995}$: $Eu_{0.008}$ | 0.067 | 0.264 | 1 | 0.333 | — | 0.004 | Y | 1800 | 12 | 0.1 |
| | 6 $Ca_{0.05}Sr_{0.942}Al_1Si_1O_{0.012}N_{2.995}$: $Eu_{0.008}$ | 0.0167 | 0.314 | 1 | 0.333 | — | 0.004 | Y | 1800 | 12 | 0.1 |
| | 7 $Ca_{0.02}Sr_{0.972}Al_1Si_1O_{0.012}N_{2.995}$: $Eu_{0.008}$ | 0.0067 | 0.324 | 1 | 0.333 | — | 0.004 | Y | 1800 | 12 | 0.1 |
| | 8 $Ca_{0.05}Sr_{0.948}Al_1Si_1O_{0.003}N_{2.999}$: $Eu_{0.002}$ | 0.0167 | 0.316 | 1 | 0.333 | — | 0.001 | Y | 1800 | 12 | 0.1 |
| | 9 $Ca_{0.05}Sr_{0.946}Al_1Si_1O_{0.006}N_{2.997}$: $Eu_{0.004}$ | 0.0167 | 0.315 | 1 | 0.333 | — | 0.002 | Y | 1800 | 12 | 0.1 |
| | 10 $Ca_{0.05}Sr_{0.938}Al_1Si_1O_{0.018}N_{2.992}$: $Eu_{0.012}$ | 0.0167 | 0.313 | 1 | 0.333 | — | 0.006 | Y | 1800 | 12 | 0.1 |
| | 11 $Ca_{0.05}Sr_{0.934}Al_1Si_1O_{0.024}N_{2.989}$: $Eu_{0.016}$ | 0.0167 | 0.311 | 1 | 0.333 | — | 0.008 | Y | 1800 | 12 | 0.1 |
| | 12 $Ca_{0.45}Sr_{0.546}Al_1Si_1O_{0.006}N_{2.997}$: $Eu_{0.004}$ | 0.15 | 0.182 | 1 | 0.333 | — | 0.002 | Y | 1800 | 12 | 0.1 |
| | 13 $Ca_{0.45}Sr_{0.534}Al_1Si_1O_{0.034}N_{2.989}$: $Eu_{0.016}$ | 0.15 | 0.178 | 1 | 0.333 | — | 0.008 | Y | 1800 | 12 | 0.1 |
| | 14 $Ca_{0.992}Al_1Si_1O_{0.012}N_{2.995}$: $Eu_{0.008}$ | 0.331 | — | 1 | 0.333 | — | 0.004 | Y | 1800 | 12 | 0.1 |
| | 15 $Ca_{0.65}Sr_{0.342}Al_1Si_1O_{0.087}N_{2.945}$: $Eu_{0.008}$ | 0.217 | 0.114 | 0.95 | 0.333 | 0.025 | 0.004 | Y | 1800 | 12 | 0.1 |
| Comparative example | 1 $Ca_{0.90}Sr_{0.092}Al_1Si_1O_{0.012}N_{2.995}$: $Eu_{0.008}$ | 0.3 | 0.031 | 1 | 0.333 | — | 0.004 | N | 1800 | 12 | 0.1 |
| | 2 $Ca_{0.45}Sr_{0.542}Al_1Si_1O_{0.012}N_{2.995}$: $Eu_{0.008}$ | 0.15 | 0.181 | 1 | 0.333 | — | 0.004 | N | 1800 | 12 | 0.1 |
| | 3 $Ca_{0.20}Sr_{0.792}Al_1Si_1O_{0.012}N_{2.995}$: $Eu_{0.008}$ | 0.067 | 0.264 | 1 | 0.333 | — | 0.004 | N | 1800 | 12 | 0.1 |
| | 4 $Ca_{0.05}Sr_{0.942}Al_1Si_1O_{0.012}N_{2.995}$: $Eu_{0.008}$ | 0.0167 | 0.314 | 1 | 0.333 | — | 0.004 | N | 1800 | 12 | 0.1 |
| | 5 $Ca_{0.992}Al_1Si_1O_{0.012}N_{2.995}$: $Eu_{0.008}$ | 0.331 | — | 1 | 0.333 | — | 0.004 | N | 1800 | 12 | 0.1 |
| | 6 $Ca_{0.45}Sr_{0.549}Al_1Si_1O_{0.002}N_{2.999}$: $Eu_{0.001}$ | 0.15 | 0.183 | 1 | 0.333 | — | 0.0005 | Y | 1800 | 12 | 0.1 |
| | 7 $Ca_{0.45}Sr_{0.525}Al_1Si_1O_{0.038}N_{2.983}$: $Eu_{0.025}$ | 0.15 | 0.175 | 1 | 0.333 | — | 0.0125 | Y | 1800 | 12 | 0.1 |

TABLE 2

| | | real composition | | | sintering condition | value of chromaticity | | luminance | | $D_{50}$ |
| | Composition of the raw materials | Sr | Eu | Al | sirtightness | x | y | $L_{example2}$ = 100 | $L_{BaSO4}$ = 1 | μm |
|---|---|---|---|---|---|---|---|---|---|---|
| example | 1 $Ca_{0.83}Sr_{0.162}Al_1Si_1O_{0.012}N_{2.995}$: $Eu_{0.008}$ | 0.147 | 0.008 | 1 | Y | 0.674 | 0.324 | 83 | 75 | 9.1 |
| | 2 $Ca_{0.65}Sr_{0.342}Al_1Si_1O_{0.012}N_{2.995}$: $Eu_{0.008}$ | 0.2972 | 0.008 | 1 | Y | 0.666 | 0.332 | 100 | 90 | 8.5 |
| | 3 $Ca_{0.45}Sr_{0.542}Al_1Si_1O_{0.012}N_{2.995}$: $Eu_{0.008}$ | 0.4846 | 0.008 | 1 | Y | 0.654 | 0.344 | 127 | 114 | 8 |
| | 4 $Ca_{0.25}Sr_{0.742}Al_1Si_1O_{0.012}N_{2.995}$: $Eu_{0.008}$ | 0.644 | 0.008 | 1 | Y | 0.64 | 0.358 | 160 | 144 | 7.8 |
| | 5 $Ca_{0.20}Sr_{0.792}Al_1Si_1O_{0.012}N_{2.995}$: $Eu_{0.008}$ | 0.7154 | 0.008 | 1 | Y | 0.634 | 0.364 | 176 | 158 | 7.7 |
| | 6 $Ca_{0.05}Sr_{0.942}Al_1Si_1O_{0.012}N_{2.995}$: $Eu_{0.008}$ | 0.8037 | 0.008 | 1 | Y | 0.621 | 0.378 | 240 | 216 | 9.8 |
| | 7 $Ca_{0.02}Sr_{0.972}Al_1Si_1O_{0.012}N_{2.995}$: $Eu_{0.008}$ | 0.8241 | 0.008 | 1 | Y | 0.617 | 0.382 | 242 | 218 | 9.5 |
| | 8 $Ca_{0.05}Sr_{0.948}Al_1Si_1O_{0.003}N_{2.999}$: $Eu_{0.002}$ | 0.8037 | 0.002 | 1 | Y | 0.588 | 0.409 | 216 | 194 | 9.9 |
| | 9 $Ca_{0.05}Sr_{0.946}Al_1Si_1O_{0.006}N_{2.997}$: $Eu_{0.004}$ | 0.8037 | 0.004 | 1 | Y | 0.601 | 0.397 | 256 | 230 | 9.5 |
| | 10 $Ca_{0.05}Sr_{0.938}Al_1Si_1O_{0.018}N_{2.992}$: $Eu_{0.012}$ | 0.8037 | 0.012 | 1 | Y | 0.631 | 0.368 | 220 | 198 | 9.6 |
| | 11 $Ca_{0.05}Sr_{0.934}Al_1Si_1O_{0.024}N_{2.989}$: $Eu_{0.016}$ | 0.8037 | 0.016 | 1 | Y | 0.635 | 0.363 | 210 | 189 | 9.8 |
| | 12 $Ca_{0.45}Sr_{0.546}Al_1Si_1O_{0.006}N_{2.997}$: $Eu_{0.004}$ | 0.488 | 0.004 | 1 | Y | 0.64 | 0.358 | 146 | 131 | 8.1 |
| | 13 $Ca_{0.45}Sr_{0.534}Al_1Si_1O_{0.024}N_{2.989}$: $Eu_{0.016}$ | 0.475 | 0.016 | 1 | Y | 0.666 | 0.332 | 104 | 94 | 8.2 |
| | 14 $Ca_{0.992}Al_1Si_1O_{0.012}N_{2.995}$: $Eu_{0.008}$ | 0 | 0.008 | 1 | Y | 0.68 | 0.317 | 65 | 59 | 10.1 |
| | 15 $Ca_{0.65}Sr_{0.342}Al_1Si_1O_{0.087}N_{2.945}$: $Eu_{0.008}$ | 0.342 | 0.008 | 1 | Y | 0.662 | 0.336 | 109 | 98 | 8.9 |

TABLE 2-continued

| | | Composition of the raw materials | real composition Sr | Eu | Al | sintering condition sirtightness | value of chromaticity x | y | luminance $L_{example2} = 100$ | $L_{BaSO4} = 1$ | $D_{50}$ μm |
|---|---|---|---|---|---|---|---|---|---|---|---|
| comparative example | 1 | $Ca_{0.90}Sr_{0.092}Al_1Si_1O_{0.012}N_{2.995}$: $Eu_{0.008}$ | 0.0586 | 0.008 | 1 | N | 0.662 | 0.334 | 79 | 71 | 9.5 |
| | 2 | $Ca_{0.45}Sr_{0.542}Al_1Si_1O_{0.012}N_{2.995}$: $Eu_{0.008}$ | 0.2913 | 0.008 | 1 | N | 0.654 | 0.342 | 82 | 74 | 8.1 |
| | 3 | $Ca_{0.20}Sr_{0.792}Al_1Si_1O_{0.012}N_{2.995}$: $Eu_{0.008}$ | 0.3296 | 0.008 | 1 | N | 0.64 | 0.355 | 88 | 79 | 8.6 |
| | 4 | $Ca_{0.05}Sr_{0.942}Al_1Si_1O_{0.012}N_{2.995}$: $Eu_{0.008}$ | 0.122 | 0.008 | 1 | N | 0.614 | 0.379 | 89 | 80 | 9.5 |
| | 5 | $Ca_{0.992}Al_1Si_1O_{0.012}N_{2.995}$: $Eu_{0.008}$ | 0 | 0.008 | 1 | N | 0.661 | 0.335 | 87 | 78 | 9.8 |
| | 6 | $Ca_{0.45}Sr_{0.549}Al_1Si_1O_{0.002}N_{2.997}$: $Eu_{0.001}$ | 0.49 | 0.001 | 1 | Y | 0.621 | 0.378 | 110 | 99 | 7.9 |
| | 7 | $Ca_{0.45}Sr_{0.525}Al_1Si_1O_{0.038}N_{2.983}$: $Eu_{0.025}$ | 0.469 | 0.025 | 1 | Y | 0.673 | 0.324 | 80 | 72 | 7.6 |

From the results shown in table 2, it can be seen that by the use of the adhesion agent, the sintering holder can be airtight, and therefore a preferred composition of the phosphor can be obtained. Comparing the phosphor of the example 5 and that of the comparative example 3, though the same composition of raw material ($Ca_{0.20}Sr_{0.792}Al_1Si_1O_{0.012}N_{2.995}$:$Eu_{0.008}$) is used, the resultant phosphors have different composition, whereas the phosphor of the example 5 has a content of strontium (Sr) that is close to the content of the raw material (the difference is only 9.7%). As for the comparative example 3, the difference of the content of strontium (Sr) between the resultant phosphor and the raw material is very large (58.4%). Further, the value of chromaticity (0.634, 0.364) and the luminance (158 units) of the phosphor in example 5 are different from the value of chromaticity (0.640, 0.355) and the luminance (79 units) of the comparative example 3. Based on the same value of chromaticity, the phosphor of the present invention has a higher luminance than that of the prior arts of the same series. For example, according to the phosphors of the example 3 and comparative example 2, though they have the same value of chromaticity of (0.654, 0.344±0.002), the luminances are 114 units and 74 units respectively. Therefore, it can be seen that the phosphor of the present invention has a higher luminance than that of prior arts of the same series and can be applied to a light emitting device to ensure a high luminance.

Therefore, even though the same composition for the raw material is used in the present invention and in any prior method, the light emitted from the phosphor that is made by the present invention has chromaticity and luminance apparently higher than those of prior arts of the same series. Even though a conventional phosphor may have a value of chromaticity the same as that of the phosphor of the present invention, the conventional phosphor still can not have the same real composition and luminance as those of the present invention. The phosphor of example 14 of the present invention can emit a light having a high x value (0.680), a low y value (0.317), and a high luminance, and therefore can satisfy the commercial demands for high saturation and luminance for a phosphor. According to the examples 1 and 14, the lights emitted by those phosphors having chromaticity coordinates (x, y) of (0.674, 0.324) and (0.680, 0.317) respectively, which cannot be obtained by any conventional phosphors of the same series. Also, from the testing result of comparative examples 6 and 7, it is proved that the element such as Eu (europium) should be well adjusted in a proper range of the present invention, in order to obtain a high luminance.

As mention above, by the use of the adhesion agent, the airtightness of the whole sintering holder can be improved, and elements such as strontium and calcium which inherently tend to be easily vaporized can be blocked firmly in the sintering holder and efficiently combined with other atoms to provide an optimized phosphor. Therefore, the difference of the chemical compositions between the raw material and the resultant phosphor can be minimized, so that the manufacturing cost can be lowered and a phosphor with high luminance can be realized. That is, the coordinates of chromaticity and the high luminance of the light emitted by the phosphor of the present invention cannot be easily achieved by any conventional phosphors of the same series. The phosphor of the present invention can be used to increase the color rendering property of white light and the color saturation, and therefore can be applied to various applications, and the object of the present invention can be achieved.

Although the present invention has been explained in relation to its preferred embodiment, it is to be understood that many other possible modifications and variations can be made without departing from the spirit and scope of the invention as hereinafter claimed.

What is claimed is:

1. A method of providing a phosphor with a precisely controlled element composition, which comprises steps:
    (A) providing a sintering holder comprising a main body and a closure member, in which the main body has a sintering space, and the closure member is used to close the sintering space;
    (B) placing a raw material of the phosphor in the sintering space of the main body;
    (C) coating an adhesion agent on at least one of the main body and the closure member; and
    (D) heating the sintering holder containing the raw material under a non-oxidizing gas atmosphere to obtain a phosphor, wherein the adhesion agent comprises boron nitride, and at least one selected from the group consisting of an alkaline earth metal nitride and a boron oxide.

2. The method of providing a phosphor with a precisely controlled element composition as claimed in claim 1, wherein in the step (D), the adhesion agent is cured to form a compact structure.

3. The method of providing a phosphor with a precisely controlled element composition as claimed in claim 1, wherein in the step (D), the adhesion agent is used to seal the main body and the closure member to make the sintering space airtight.

4. The method of providing a phosphor with a precisely controlled element composition as claimed in claim 1, wherein the content of the boron nitride is that every 1 mole of the adhesion agent comprises 0.5 mole or above of the boron nitride.

5. The method of providing a phosphor with a precisely controlled element composition as claimed in claim 1, wherein in the step (D), the heating is performed under a pressure of 0.5 Mpa or less.

6. The method of providing a phosphor with a precisely controlled element composition as claimed in claim 1, wherein in the step (D), the heating temperature is in a range of 1200° C.~2200° C.

7. The method of providing a phosphor with a precisely controlled element composition as claimed in claim 1, wherein in the step (D), the temperature rising rate is in a range of 3° C./min~15° C./min.

8. The method of providing a phosphor with a precisely controlled element composition as claimed in claim 1, wherein in the step (D), the time period of the heating is in a range of 1 hour~12 hours.

9. The method of providing a phosphor with a precisely controlled element composition as claimed in claim 1, wherein the raw material comprises aluminum source, silicon source, europium source, and at least one of calcium source and strontium source.

10. The method of providing a phosphor with a precisely controlled element composition as claimed in claim 9, wherein the aluminum source, silicon source, europium source, calcium source, and strontium source are aluminum nitride, silicon nitride, europium oxide, calcium nitride, and strontium nitride respectively.

11. The method of providing a phosphor with a precisely controlled element composition as claimed in claim 9, wherein the mole ratio between the calcium, strontium, aluminum, silicon, and europium in the calcium source, strontium source, aluminum source, silicon source, and europium source, respectively is [calcium: strontium: aluminum: silicon: europium]=[(0.01~0.999):(0~0.99):(0.95~1):1:(0.002~0.02)].

12. The method of providing a phosphor, as claimed in claim 1, wherein the phosphor is represented by [formula 1]:

$$Ca_aSr_bAl_cSi_dO_eN_f:Eu_g; \quad \text{[formula 1]}$$

wherein $0 \le a < 1$, $0 < b < 1$, $c=1$, $0.8 \le d \le 1.2$, $0 \le e \le 0.5$, $2.5 \le f \le 3.1$, $0.002 \le g \le 0.020$, a and b are not both 0 at the same time; and CIE 1931 chromaticity coordinates (x,y) of a light emitted from the phosphor, which is excited by a wavelength of 455 nm, satisfy the formulae:

$$x=[(-0.1059b^3+0.068b^2-0.06b)+(2152.8g^3-309.2g^2+8.2943g)+0.6324]\pm0.002;$$

$$y=[(-0.1295b^3-0.0968b^2+0.0702b)+(-3299.2g^3+311.08g^2-7.9266g)+0.3621]\pm0.002.$$

13. The method of providing a phosphor as claimed in claim 12, wherein a corresponding luminance of the phosphor is in a range of 55 units to 235 units, based on taking the light that is reflected by radiating a light with wavelength of 455 nm on a barium sulphate as one unit.

14. The method of providing a phosphor as claimed in claim 12, wherein the CIE 1931 chromaticity coordinates (x, y) of the light emitted by the phosphor satisfy: $0.670 \le x \le 0.683, 0.15 \le y \le 0.326$.

15. The method of providing a phosphor as claimed in claim 12, wherein $0.1 \le b \le 0.95$.

16. The method of providing phosphor as claimed in claim 12, wherein $0.005 \le g \le 0.016$.

* * * * *